United States Patent [19]

Runas

[11] Patent Number: 5,455,526
[45] Date of Patent: Oct. 3, 1995

[54] DIGITAL VOLTAGE SHIFTERS AND SYSTEMS USING THE SAME

[75] Inventor: Michael E. Runas, McKinney, Tex.

[73] Assignee: Cirrus Logic, Inc., Fremont, Calif.

[21] Appl. No.: 288,442

[22] Filed: Aug. 10, 1994

[51] Int. Cl.$^6$ .................. H03K 19/0175; H03K 19/094
[52] U.S. Cl. .............................................. 326/81; 326/68
[58] Field of Search .................................. 326/80, 81, 68

[56] References Cited

U.S. PATENT DOCUMENTS

| | | | |
|---|---|---|---|
| 3,906,254 | 9/1975 | Lane et al. | 326/81 |
| 4,450,371 | 5/1984 | Bismarck | 326/80 |
| 4,486,670 | 12/1984 | Chan et al. | 326/68 |
| 4,730,131 | 3/1988 | Sauer | 326/68 |
| 4,978,870 | 12/1990 | Chen et al. | 326/68 |

Primary Examiner—Edward P. Westin
Assistant Examiner—Richard Roseen
Attorney, Agent, or Firm—Winstead Sechrest & Minick

[57] ABSTRACT

A digital voltage shifter 101 is provided which includes an input buffer 200 having an input for receiving data logic high signals at a first voltage, a true output and a complementary output. A static random access memory cell 220 is also included which operates in response to a voltage supply providing a second voltage differing from the first voltage and having a first input coupled to the true output of the input buffer and a second input coupled to the complementary output of the input buffer. An output driver 230 is further included which operates in response to the second supply voltage and is coupled to an output of the memory cell, the output driver outputting the received logic signals at the second voltage.

23 Claims, 2 Drawing Sheets

5,455,526

DIGITAL VOLTAGE SHIFTERS AND SYSTEMS USING THE SAME

TECHNICAL FIELD OF THE INVENTION

The present invention relates in general to electronic devices and systems and in particular to digital voltage shifters and systems using the same.

BACKGROUND OF THE INVENTION

In many electronic systems it becomes necessary to shift the voltage levels of signals travelling between circuits or devices operating at different supply voltages. For example, a digital integrated circuit may include core logic circuitry operating in conjunction with a 3 volt voltage supply and associated input/output circuitry operating in conjunction with a 5 volt voltage supply. The logic high signals output from the core logic to the I/O circuitry will be at approximately 3 volts, and therefore shifting upward is required to insure that such signals meet the input voltage threshold and noise immunity requirements of the 5 volt I/O circuitry. In the other direction, logic high signals travelling from the I/O circuitry to the core logic circuitry will be at approximately 5 volts and therefore shifting downward is required to insure that the maximum input voltage of the core circuitry is not be exceeded. There are numerous other instances where voltage shifting, upwards or downwards, is required.

Currently available voltage shifting circuits are typically of an analog design. Such analog circuits, especially those employing ratioed inverters, consume a substantial amount of power. Given the importance of power conservation in most electronic circuits and systems, the need has arisen for improved voltage shifting circuitry and methods which minimize power consumption.

SUMMARY OF THE INVENTION

The principles of the present invention provide for the construction of digital voltage shifting circuits and systems. In general, voltage shifting circuits according to the present invention include an input buffer, a static random access memory cell, and an output driver arranged such that the possibility of dwelling on a transistor gate and consequently consuming a large amount of power is substantially reduced. Further, the principles of the present invention provide for the construction of a voltage shifter with an output that can be switched into a high impedance state such that the voltage shifter may be coupled to a multiplexed bus.

According to a first embodiment of the present invention, a digital voltage shifter is provided which includes an input buffer having an input for receiving data logic high signals at a first voltage, a true output and a complementary output. A static random access memory cell is provided which operates in response to a voltage supply providing a second voltage differing from the first voltage and having a first input coupled to the true output of the input buffer and a second input coupled to the complementary output of the input buffer. An output driver is also included which operates in response to the second voltage and is coupled to an output of the memory cell, the output driver outputs the logic high signals at the second voltage.

According to a second embodiment of the present invention, a voltage shifter is provided for shifting the voltage of logic high data signals from a first voltage to a second voltage. A first transistor of a first type is included having a control terminal for retrieving the data signals at the first voltage, a first current path terminal and a second current path terminal coupled to a low voltage. An inverter is also provided having an input for receiving the data signals. A second transistor of the first type has a control terminal coupled to an output of the inverter, a first current path terminal and a second current path terminal coupled to the low voltage. A third transistor of a second type is included which has a first current path terminal coupled to a voltage supply providing the second voltage and a control terminal coupled to the first current path terminal of the first transistor. A fourth transistor of the first type has a first current path terminal coupled to a second current path terminal of the third transistor, a second current path terminal coupled to the low voltage, and a control terminal coupled to the first current path terminal of the first transistor. A fifth transistor is provided being of the second type and having a first current path terminal coupled to the voltage supply, a second current path terminal coupled to the first current path terminal of the first transistor, and a control terminal coupled to the first current path terminal of the second transistor. Finally, a sixth transistor being of the first type is provided having a first current path terminal coupled to the second current path terminal of the fifth transistor, a second current path terminal coupled to the low voltage, and a control terminal coupled to the first current path terminal of the second transistor. A node at the coupling of the second current path terminal of the fifth transistor and the first current path terminal of the sixth transistor comprises the memory cell output.

According to a third embodiment of the present invention, a digital voltage shifter is provided which includes a first n-channel transistor having a gate for receiving data at a first voltage and a second source/drain coupled to a low voltage. An inverter is also provided having input for receiving the data at the first voltage. A second n-channel transistor has a gate coupled to an output of the inverter and a first source/drain coupled to the low voltage. A first p-channel transistor is included which has a first source/drain coupled to a voltage supply providing a second voltage and a gate coupled to a second source/drain of the first n-channel transistor. A third n-channel transistor has a first source/drain coupled to a second source/drain of the first p-channel transistor, a second source/drain coupled to the low voltage, and a gate coupled to the second source/drain of the first n-channel transistor. A second p-channel transistor has a source/drain coupled to the voltage supply, a second source/drain coupled to the second source/drain of the first n-channel transistor, and a gate coupled to a second source/drain of the second n-channel transistor. A fourth n-channel transistor has a first source/drain coupled to the second source/drain of the second p-channel transistor, a second source/drain coupled to the low voltage and a gate coupled to the second source/drain of the second n-channel transistor. An output driver is coupled to a node at the coupling of the second source/drain of the second p-channel transistor and the first source/drain of the fourth n-channel transistor.

The principles of the present invention are also embodied in electronic systems requiring voltage shifting. Thus, according to a third embodiment of the present invention, circuitry is provided which includes first circuitry operable to output signals at a first voltage and second circuitry operable to receive signals at a second voltage. A voltage shifter is included having an input coupled to the first circuitry and an output coupled to the second circuitry. The voltage shifter receiving signals from the first circuitry at the first voltage and outputting such signals to the second circuitry at the second voltage. The voltage shifter includes an input buffer having an input for receiving the signals at the first voltage from the first circuitry, a true output and a complementary output. A static random access memory cell is provided as part of the voltage shifter which operates in response to a voltage supply providing the second voltage and has a first input coupled to the true output of the input buffer and a second input coupled to the complementary output of the input buffer. The voltage shifter also includes an output driver operating in response to the second voltage and which is coupled to an output of the memory cell, the output driver outputs the signals to the second circuitry at the second voltage.

Systems and circuits embodying the principles of the present invention have substantial advantages over the prior art devices. In particular, such circuits and systems use substantially less power than the currently available analog voltage shifting circuits. Further, the principles of the present invention provide for the construction of voltage shifters which have an output which may be switched to a high impedance state thereby allowing the use of such voltage shifters in a multiplexed bus system.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
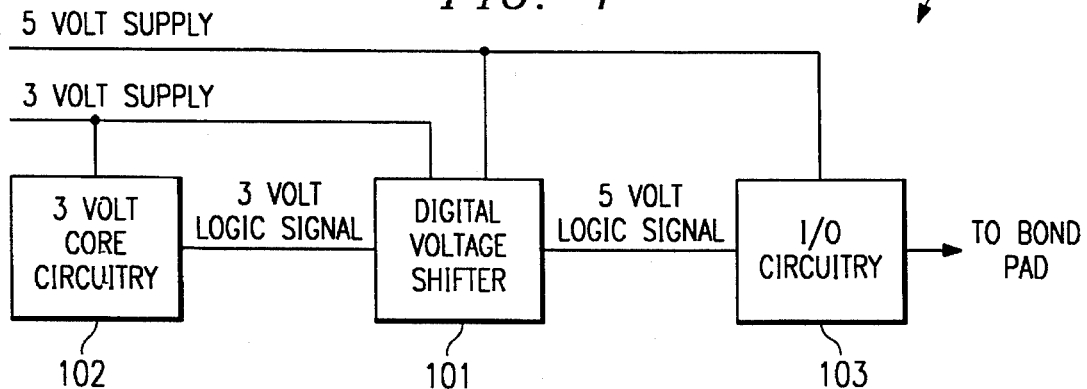
FIG. 1 is a functional block diagram of a typical electronic system in which voltage shifting is required.
Figure 2:
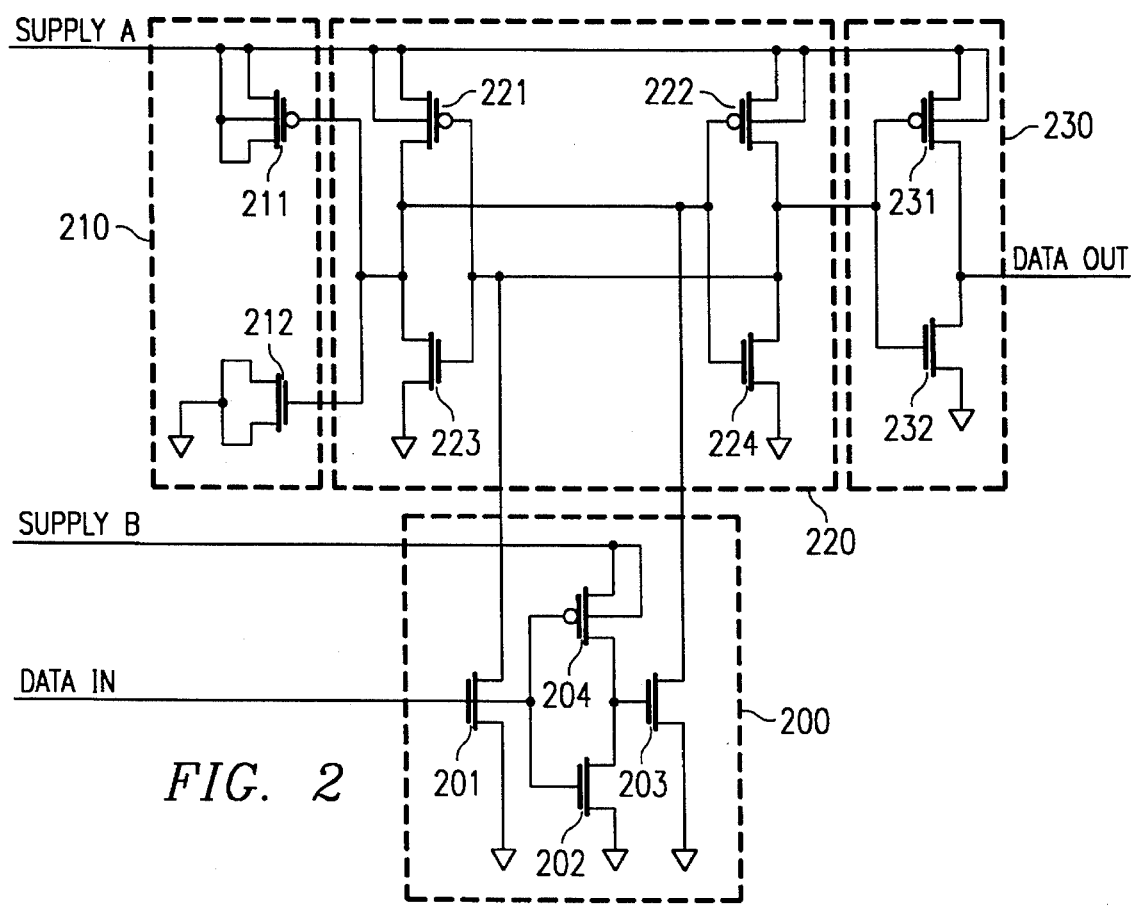
FIG. 2 is an electrical schematic diagram of a digital voltage shifter according to the principles of the present invention.
Figure 3:
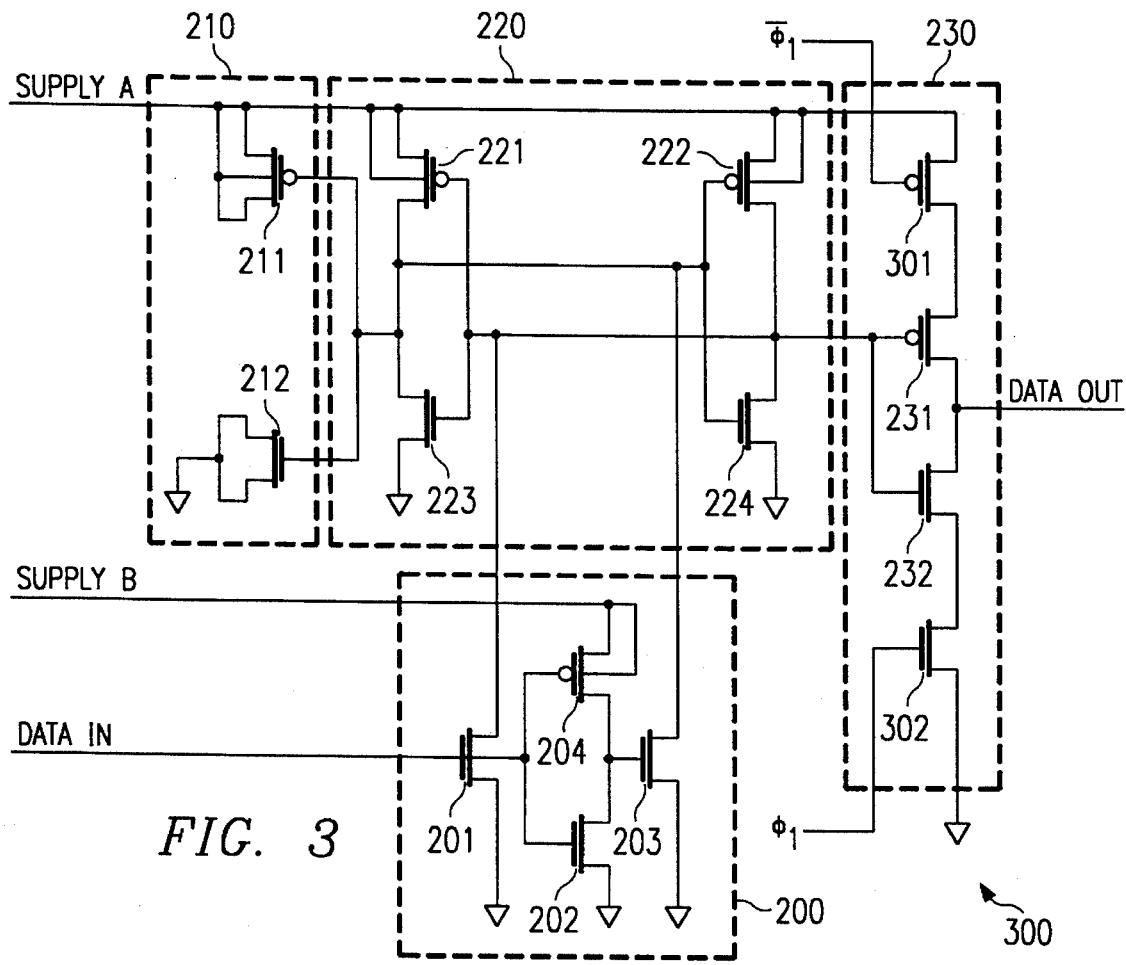
FIG. 3 is an electrical schematic diagram of a second digital voltage shifter according to the principles of the present invention.

The principles of the present invention and their advantages are best understood by referring to the illustrated embodiment depicted in FIGS. 1–3 of the drawings, in which like numbers designate like parts.

FIG. 1 is a functional block diagram of a digital integrated circuit system 100 employing a digital voltage shifter 101 embodying the principles of the present invention. It should be noted that system 100 is illustrative of the uses of voltage shifter 101 and that the use of voltage shifter 101 is not limited thereto; voltage shifter 101 may be employed in any one of a number of devices, circuits and systems in which voltage shifting is desired. System 100 includes core processing circuitry 102 which outputs logic high digital data at a voltage level of approximately +3 volts as a function of a +3 volt power supply. Core logic circuitry 102 performs the primary data processing functions of system 100. System 100 also includes input/output circuitry 103 which provides an interface with associated systems, circuits or devices. In a digital integrated circuit application, I/O circuitry 103 receives data from and transmits data to the device bond pads. I/O circuitry 103 operates in conjunction with a +5 volt power supply and inputs and outputs logic high data at approximately the +5 volt level. Assuming for the purposes of discussion that data is being transmitted from core circuitry 102 to I/O circuitry 103 for output. In this case, voltage shifter 101 shifts upward the +3 volt logic high signals to the +5 volt level required to meet the input voltage threshold requirements of I/O circuitry 103. As will become apparent in the discussion below, voltage shifter can also be used to down shift signals (data) being transmitted from I/O circuitry 102 at the +5 volt level to the +3 volt level required by core logic circuitry 102.

FIG. 2 is an electrical schematic diagram of a preferred embodiment of voltage shifter 101. Voltage shifter 101 generally includes an input buffer section 200, a load section 210, a static random access memory (SRAM) cell 220, and an output driver section 230. Each of these sections will be discussed in detail below; however, it should be recognized at this point that the transistor types and voltages shown in FIGURE may be reversed in alternate embodiments. It should also be recognized that the embodiment of voltage shifter 101 shown in FIG. 2 may be used to shift the voltage level of a data stream either up or down, depending on the supply voltage connections.

Input buffer section 200 includes n-channel transistors 201, 202 and 203 and p-channel transistor 204. The gates of n-channel transistors 201 and 202 and p-channel transistor 204 are coupled to the input signal source data in which in the example where data is being transferred from core logic 102 to I/O circuitry 103 system 100 is core circuitry 102. One source/drain of each n-channel transistor 201 and 203 is coupled to SRAM section 220 (these source/drain terminals of transistors 201 and 203 respectively comprise the complementary and true outputs of input buffer section 200). One source/drain and the tank of p-channel transistor 204 are coupled to Voltage Supply B (+3 volts for the voltage up-shifting case in system 100). The other source/drain of p-channel transistor 204 and the other source/drain of n-channel transistor 202 are coupled together and to the gate of n-channel transistor 203 (transistors 202 and 204 form an invertor with their coupled gates being the invertor input and their coupled source/drains being the invertor output). The other source/drains of n-channel transistors 201, 202 and 203 are coupled to $V_{ss}$ (zero volts) or ground. In the case where the voltage of voltage supply B is less than the voltage of voltage supply A, the threshold voltages $V_L$ of transistors 201, 202 and 203 are preferably selected to allow for a switching point of Voltage B/2 for the transistor 202/transistor 204 inverter.

Load section 210 includes a p-channel transistor 211 and an n-channel transistor 212. Both source/drains and the tank of p-channel transistor 211 are coupled to Voltage Supply A (+5 volts for the voltage up-shifting case in system 100). Both source/drains of n-channel transistor 212 are coupled to $V_{ss}$ (zero volts) or ground. The gates of both load transistors 211 and 212 are coupled together and to SRAM section 220.

SRAM section 220 includes a pair of p-channel transistors 221 and 222 and a pair of n-channel transistors 223 and 224. One source/drain and the tank of each p-channel transistor 221 and 222 is coupled to Voltage Supply A. The other source/drain of p-channel transistor 221 is coupled to the gates of transistors 211 and 212 of load section 210, one source/drain of n-channel transistor 223, the true output of input buffer section 200, and the gates of transistors 222 and 224. The other source/drain of p-channel transistor 222 is coupled to output driver section 230, one source/drain of n-channel transistor 224, and the complementary output of input buffer 200, and the gates of transistors 221 and 223. The other source/drains of n-channel transistors 223 and 224 are coupled to ground $V_{ss}$ (zero volts). The gates of transistors 211 and 212 represent one input to SRAM section 220 and the gates of transistors 222 and 224 another input thereto.

Output driver section 230 includes a p-channel transistor 231 and an n-channel transistor 232. One source/drain and the tank of p-channel transistor 231 are coupled to Voltage Supply A. The other source/drain of transistor 231 is coupled to one source/drain of n-channel 232, such connection also providing the output of voltage shifter 101. The other source/drain of n-channel transistor 232 is coupled to ground. The gates of transistors 231 and 232 are coupled to the source/drains of transistors 222 and 224 (the output of SRAM section 220).

The operation of the embodiment of voltage shifter 101 described in FIG. 2 can now be described. When a logic high signal is received at the input DATA IN, n-channel transistors 201 and 202 turn on and transistors 202 and 203 turn off. When transistor 201 turns on, the gate of p-channel transistor 221 of SRAM section 220 is pulled down and transistor 221 turns on. Transistor 224, along with transistor 201, pulls down the gate of output driver transistor 231. Transistor 213 turns on and the output DATA OUT is pulled to approximately the voltage of Voltage Supply B.

When a logic low signal is received at the input DATA IN, transistors 201 and 202 of input buffer 200 turn off and transistors 204 and 203 turn on. When transistor 203 turns on, the gate of transistor 222 is pulled low thereby turning on transistor 222. The voltage of Voltage Supply A passed by transistor 222 turns on n-channel output drive transistor 232 and the output DATA OUT is pulled low. Additionally, n-channel transistor 223 turns on which helps pull down the gate of transistor 222.

The embodiment of voltage shifter 101 depicted in FIG. 2 is preferably employed to drive a unidirectional bus crossing power supply boundaries. As discussed above, the circuit of FIG. 2 may be used, depending on the voltages provided by Supply A and Supply B, to either shift-up the voltage of data being sent from core circuitry 102 to I/O circuitry 103 via a unidirectional bus or shift down the voltage of data being sent from I/O circuitry 103 to core circuitry 102 via a unidirectional bus. The Voltage shifter embodiment 300 depicted in FIG. 3 however may be used to shift voltages on a multiplexed bus crossing power supply boundaries.

In voltage shifter 300 of FIG. 3, an additional p-channel transistor 301 and an additional n-channel transistor 302 have been included in output driver section 230. Transistor 301 includes a source/drain coupled to Voltage Supply A, another source/drain coupled to transistor 231 and a gate coupled to a control signal Φ 1. Transistor 302 includes a source/drain coupled to transistor 232, another source/drain coupled to ground and a gate coupled to the complement of control signal Φ 1 ($\overline{\Phi 1}$).

The output driver section 230 of voltage shifter 300 allows the data output DATA OUT to be coupled to a multiplexed bus since DATA OUT can be set to a high impedance state while a second device is driving the bus. Specifically, when $\overline{\Phi 1}$ is set high (i.e., to a voltage equal to the voltage of Voltage Supply A) and Φ 1 is set low the DATA OUT output is in a high impedance state. When control signal $\overline{\Phi 1}$ is low and Φ 1 is high, the voltage at the output DATA OUT is controlled by transistors 231 and 232 as described above.

Figure 4:
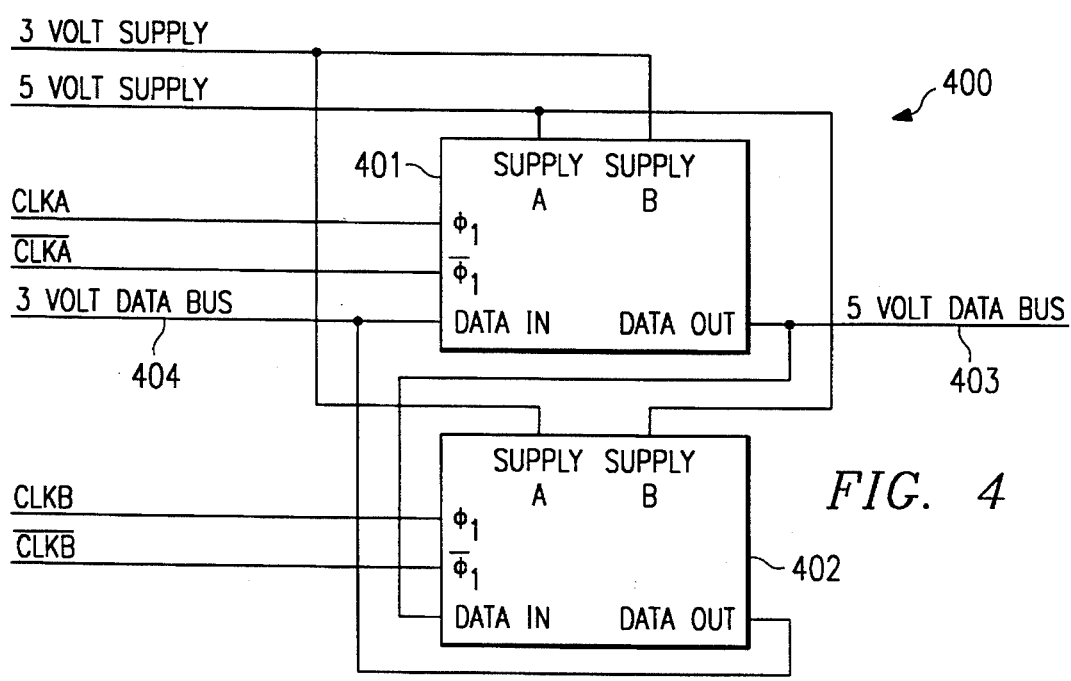
FIG. 4 is a functional block diagram of a bidirectional level shifting buffer using the voltage shifter of FIG. 3.

FIG. 4 depicts a bidirectional level shifting buffer 400 employing a pair of voltage shifters 401 and 402 each constructed in accordance with embodiment of FIG. 3. For illustration purposes, it will be assumed that buffer 400 is interfacing a 5 volt data bus 403 and a 3 volt data bus 404. When CLKA is set to 5 volts, CLKA bar to 0 volts, CLKB to 0 volts and CLKB bar to 3 volts, data received on 3 volt bus 404 is shifted up to 5 volts and transferred to 5 volt bus 403. When CLKA is set to 0 volts, CLKA bar to 5 volts, CLKB to 3 volts and CLKB bar to 0 volts, data received on 5 volt bus 403 is shifted down to 3 volts and transferred to 3 volt bus 404.

The embodiments of the present invention provide substantial advantages over the prior art voltage shifting circuits and methods. Among other things, the use of digital techniques lessens the possibility of dwelling on a transistor gate and consuming a large amount of power. Further, the principles of the present invention provide for a voltage shifter with an output that can be switched into a high impedance state such that the voltage shifter may be coupled to a multiplexed bus.

Although the present invention and its advantages have been described in detail, it should be understood that various changes, substitutions and alterations can be made herein without departing from the spirit and scope of the invention as defined by the appended claims.

What is claimed is:

1. A digital voltage shifter comprising:

an input buffer having an input for receiving data logic high signals at a first voltage, a true output and a complementary output;

a static random access memory cell operating in response to voltage supply providing a second voltage differing from said first voltage, said memory cell including:

a first transistor of a first type having a first source/drain coupled to said voltage supply and a gate coupled to said complementary output of said buffer;

a second transistor of a second type having a first source/drain coupled to a second source/drain of said first transistor, a second source/drain coupled to a low voltage, and a gate coupled to said complementary output of said buffer;

a third transistor of said first type having a first source/drain coupled to said voltage supply, a second source/drain coupled to said complementary output of said buffer, and gate coupled to said true output of said buffer; and a fourth transistor of said second type having a first source/drain coupled to said second source/drain of said third transistor, a second source/drain coupled to said low voltage, and a gate coupled to said true output of said input buffer and wherein a node at the coupling of said second source/drain of said third transistor and said first source/drain of said fourth transistor comprises said memory cell output; and an output driver operating in response to said second voltage and coupled to said output of said memory cell, said output driver outputting said logic high signals at said second voltage.

2. The voltage shifter of claim 1 wherein said input buffer comprises:

a first transistor having a gate for receiving said signals, a first source/drain providing said complementary output and a second source/drain coupled to a low voltage;

an inverter having an input for receiving said signals; and a second transistor having a gate coupled to an output of said inverter, a first source/drain providing said true output and a second source/drain coupled to said low voltage.

3. The voltage shifter of claim 2 wherein said invertor comprises:

a first transistor of a first type and a second transistor of a second type each having a gate for receiving said signals, said first transistor having a first source/drain coupled to a voltage supply outputting at said first voltage, a second source/drain coupled to a first source/drain of said second transistor, said second transistor having a second source/drain coupled to said low voltage.

4. The voltage shifter of claim 1 and further comprising a load including:

a first transistor of said first type having first and second source/drains coupled to said voltage supply; and a second transistor of said second type having first and second source/drains coupled to said low voltage and a gate coupled to a gate of said first transistor of said load and said second source/drain of said first transistor of said memory cell.

5. The voltage shifter of claim 3 wherein said first transistor of said first type comprises an p-channel transistor and said second transistor of said second type comprises a n-channel transistor.

6. The voltage shifter of claim 1 wherein said transistors of said first type comprise p-channel transistors and said transistors of said second type comprise n-channel transistors.

7. The voltage shifter of claim 1 wherein said output driver comprises:

a first output transistor of said first type having a first source/drain coupled to said voltage supply and a gate coupled to said output of said memory cell;

a second output transistor of said second type having a first source/drain coupled to a second source/drain of said first transistor, a second source/drain coupled to a low voltage, and a gate coupled to said output of said memory cell, a node at the coupling of said second source/drain of said first transistor and said first source/drain of said second transistor comprising a voltage shifter output.

8. The voltage shifter of claim 1 wherein said output driver comprises:

a first output transistor of said first type having a first source/drain coupled to said voltage supply and a gate coupled to a first control signal source;

a second output transistor of said first type having a first source/drain coupled to a second source/drain of said first output transistor and a gate coupled to said output of said memory cell;

a third output transistor of said second type having a first source drain coupled to a second source/drain of said second output transistor, and a gate coupled to said output of said memory cell, a node at the coupling of said second source/drain of said second output transistor and said first source/drain of said third output transistor comprising a voltage shifter output; and a fourth output transistor of said second type having a first source/drain coupled to a second source/drain of said third output transistor, a second source/drain coupled to said low voltage, and a gate coupled to a second control signal source.

9. The voltage shifter of claim 8 wherein a control signal generated by said second control signal source is the complement of a control signal generated by said first control signal source.

10. A voltage shifter for shifting the voltage of logic high data signals from a first voltage to a second voltage comprising:

a first transistor of a first type having a control terminal for receiving said signals at said first voltage, a first current path terminal and a second current path terminal coupled to a low voltage;

an invertor having an input for receiving said signals;

a second transistor of said first type having a control terminal coupled to an output of said invertor, a first current path terminal and a second current path terminal coupled to said low voltage;

a third transistor of a second type having a first current path terminal coupled to a voltage supply providing said second voltage and a control terminal coupled to said first current path terminal of said first transistor;

a fourth transistor of said first type having a first current path terminal coupled to a second current path terminal of said third transistor, a second current path terminal coupled to said low voltage, and a control terminal coupled to said first current path terminal of said first transistor;

a fifth transistor of said second type having a first current path terminal coupled to said voltage supply, a second current path terminal coupled to said first current path terminal of said first transistor, and a control terminal coupled to said first current path terminal of said second transistor; and a sixth transistor of said first type having a first current path terminal coupled to said second current path terminal of said fifth transistor, a second current path terminal coupled to said low voltage, and a control terminal coupled to said first current path terminal of said second transistor, and wherein a node at the coupling of said second current path terminal of said fifth transistor and said first current path terminal of said sixth transistor comprises an undriven output of said voltage shifter.

11. The voltage shifter of claim 10 wherein said transistors comprise field effect transistors, said control terminals comprising gates and said current path terminals comprising source/drains.

12. The voltage shifter of claim 10 wherein each of said transistors of said first type is operable to conduct current between said respective first and second current path terminals in response to the application of a positive voltage to said respective control terminals.

13. The voltage shifter of claim 12 wherein each of said transistors of said first type comprises an n-type field effect transistor.

14. The voltage shifter of claim 10 wherein each of said transistors of said second type is operable to conduct current between said respective first and second current path terminals in response to the application of a voltage of approximately zero volts to said respective control terminal.

15. The voltage shifter of claim 14 wherein each of said transistors of said second type comprises a p-channel field effect transistor.

16. The voltage shifter of claim 10 and further comprising an output driver including:

a first output transistor of said second type having a first current path terminal coupled to said voltage supply and a control terminal coupled to said undriven output of said voltage shifter;

a second output transistor of said first type having a first current path terminal coupled to a second current path terminal of said first output transistor, a second current path terminal coupled to said low voltage, and a gate coupled to said undriven output of said voltage shifter, a node at the coupling of said first current path terminal of said second output transistor and said second current path terminal of said second output transistor comprising a driven voltage shifter output.

17. The voltage shifter of claim 10 and further comprising an output driver including:

a first output transistor of said second type having a first current path terminal coupled to said voltage supply and a control terminal coupled to a first control signal source;

a second output transistor of said second type having a first current path terminal coupled to a second current path terminal of said first output transistor and a control terminal coupled to said undriven output of said voltage shifter;

a third output transistor of said first type having a first current path terminal coupled to a second current path terminal of said second output transistor, and a control terminal coupled to said undriven output of said voltage shifter, a node at the coupling of said second current path terminal of said second output transistor and said first current path terminal of said third output transistor comprising a driven voltage shifter output; and a fourth output transistor of said first type having a first current path terminal coupled to a second current path terminal of said third output transistor, a second current path terminal coupled to said low voltage, and a control terminal coupled to a second control signal source.

18. The voltage shifter of claim 17 wherein a control signal generated by said second control signal source is the complement of a control signal generated by said first control signal source.

19. Circuitry comprising:

first circuitry operable to output signals at a first voltage;

second circuitry operable to receive signals at a second voltage; and a voltage shifter having an input coupled to said first circuitry and an output coupled to said second circuitry, said voltage shifter receiving signals from said first circuitry at said first voltage and outputting said signals to said second circuitry at said second voltage, comprising:

an input buffer having an input for receiving said signals at said first voltage from said first circuitry, a true output and a complementary output;

a static random access memory cell operating in response to a voltage supply providing said second voltage and having a first input coupled to said true output of said input buffer and a second input coupled to said complementary output of said input buffer, said memory cell comprising:

a first transistor of a first type having a first source drain coupled to said voltage supply providing said second voltage and a gate coupled to said complementary output of said input buffer;

a second transistor of a second type having a first source/drain coupled to a second source/drain of said first transistor, a second source/drain coupled to said low voltage, and a gate coupled to said complementary output of said buffer;

a third transistor of said first type having a first source/drain coupled to said voltage supply providing said second voltage, a second source/drain coupled to said complementary output of said buffer, and gate coupled to said true output of said buffer;

a fourth transistor of said second type having a first source/drain coupled to said second source/drain of said third transistor, a second source/drain coupled to said low voltage, and a gate coupled to said true output of said input buffer and wherein a node at the coupling of said second source/drain of said third transistor and said first source/drain of said fourth transistor comprises an output of said memory cell; and an output driver operating in response to said second voltage and coupled to said output of said memory cell, said output driver outputting said signals to said second circuitry at said second voltage.

20. The voltage shifter of claim 19 wherein said input buffer comprises:

a first transistor having a gate for receiving said signals, a first source/drain providing said complementary output and a second source/drain coupled to a low voltage;

an invertor having an input for receiving said signals; and a second transistor having a gate coupled to an output of said invertor, a first source/drain providing said true output and a second source/drain coupled to said low voltage.

21. The voltage shifter of claim 19 wherein said output driver comprises:

a first output transistor of said first type having a first source/drain coupled to said voltage supply and a gate coupled to said output of said memory cell;

a second output transistor of said second type having a first source/drain coupled to a second source/drain of said first transistor, a second source/drain coupled to a low voltage, and a gate coupled to said output of said memory cell, a node at the coupling of said second source/drain of said first transistor and said first source/drain of said second transistor comprising a voltage shifter output.

22. A digital voltage shifter comprising:

a first n-channel transistor having a gate for receiving data at a first voltage, a first source/drain coupled to a low voltage;

an invertor having an input for receiving said data at said first voltage;

a second n-channel transistor having a gate coupled to an output of said invertor, and a first source/drain coupled to said low voltage;

a first p-channel transistor having a first source/drain coupled to a voltage supply providing a second voltage and a gate coupled to a second source/drain of said first n-channel transistor;

a third n-channel transistor having a first source/drain coupled to a second source/drain of said first p-channel transistor, a second source/drain coupled to said low voltage, and a gate coupled to said second source/drain of said first n-channel transistor;

a second p-channel transistor having a source/drain coupled to said voltage supply, a second source/drain coupled to said second source/drain of said first n-channel transistor, and a gate coupled to a second source/drain of said second n-channel transistor;

a fourth n-channel transistor having a first source/drain coupled to said second source/drain of said second p-channel transistor, a second source/drain coupled to said low voltage, and gate coupled to said second source/drain of said second n-channel transistor; and an output driver coupled to a node at the coupling of said second source/drain of said second p-channel transistor and said first source/drain of said fourth n-channel transistor.

23. The voltage shifter of claim 22 wherein said output driver is an inverting output driver.

* * * * *